United States Patent
Wagatsuma

[11] Patent Number: 6,088,271
[45] Date of Patent: Jul. 11, 2000

[54] METHOD AND APPARATUS FOR TRANSFERRING SIGNAL TO CIRCUIT WITHOUT WAVEFORM DISTORTION

[75] Inventor: Tomohiko Wagatsuma, Tokyo, Japan

[73] Assignee: NEC Corporation, Tokyo, Japan

[21] Appl. No.: 09/058,838

[22] Filed: Apr. 13, 1998

[30] Foreign Application Priority Data

May 26, 1997 [JP] Japan .................................. 9-134896

[51] Int. Cl.⁷ .................................................. G11C 16/04
[52] U.S. Cl. .............................. 365/189.05; 365/185.2; 365/191
[58] Field of Search .............................. 365/189.05, 191, 365/199, 230.08, 76, 77, 210, 189.08, 194, 185.2; 123/424; 364/724.17; 455/38.3

[56] References Cited

U.S. PATENT DOCUMENTS

| | | | |
|---|---|---|---|
| 4,783,768 | 11/1988 | Tanimura | 365/230 |
| 5,303,197 | 4/1994 | Miyashita et al. | 365/210 |
| 5,321,643 | 6/1994 | Kohsaka | 364/724.17 |
| 5,410,734 | 4/1995 | Choi et al. | 455/38.3 |
| 5,494,016 | 2/1996 | Okumura et al. | 123/424 |

*Primary Examiner*—David Nelms
*Assistant Examiner*—Thong Le
*Attorney, Agent, or Firm*—Scully, Scott, Murphy & Presser

[57] ABSTRACT

In a transfer circuit of a circuit device, a buffer circuit receives a signal in an active state to transfer to a circuit. Also, a waveform shaping circuit receives the signal in an active state to waveform-shape the received signal and transfers the waveform-shaped signal to the circuit. A selecting circuit selectively sets one of the buffer circuit and the waveform shaping circuit to the active state.

18 Claims, 3 Drawing Sheets

METHOD AND APPARATUS FOR TRANSFERRING SIGNAL TO CIRCUIT WITHOUT WAVEFORM DISTORTION

BACKGROUND OF THE INVENTION

1. Field of the Invention

The present invention relates to a circuit device, and more particularly to a signal transfer system in which semiconductor integrated circuits are mounted on a printed circuit board.

2. Description of the Related Art

When a synchronization circuit is mounted on a printed circuit board on which a lot of integrated circuits for memories and registers and so on are mounted, signals are outputted to the lot of integrated circuits. In this case, there is necessarily a case where signal receiving integrated circuits are located far apart from a signal outputting integrated circuit for the layout of the integrated circuits on the printed circuit board. Therefore, one integrate circuit can receive the signal without influence by reflection while one integrated circuit receives the signal influenced by reflection. For this reason, a buffer is generally provided in front of the input terminal of the integrated circuit in which the waveform of the received signal is distorted. Instead, a filter is provided or a design change is performed.

As mentioned above, when the lot of integrated circuits are mounted on the printed circuit board, one integrated circuit receives a signal distorted because of the influence of reflection. In this case, noise at an input terminal can not be avoided in spite of use of a single signal line, depending upon the mounted positions of the integrated circuit. The noise becomes a direct cause of an erroneous operation. If the amplitude of the noise exceeds an absolute maximum value, the integrated circuit is destroyed in many cases.

In accordance with, a design change would be accomplished or a buffer circuit would be inserted in front of the input terminal for the noise reduction as the result of system evaluation of the printed circuit board after the integrated circuits are mounted on the printed circuit board.

For this reason, the evaluation period became long and also the packaging density and power consumption are increased. Moreover, the design change is required to eliminate the waveform distortion dependent upon printed circuit board in the mass production of the printed circuit board.

SUMMARY OF THE INVENTION

The present invention is accomplished in view of above-mentioned problems. Therefore, an object of the present invention is to provide a method of correctly transferring a signal to a circuit without distortion of the signal due to noise and reflection regardless of the position to the circuit and a circuit device for the same.

In order to achieve an aspect of the present invention, a circuit device including a transfer circuit which includes a buffer circuit for receiving a signal in an active state to transfer to a circuit, a waveform shaping circuit for receiving the signal in an active state to waveform-shape the received signal and for transferring the waveform-shaped signal to the circuit, and a selecting circuit for selectively setting one of the buffer circuit and the waveform shaping circuit to the active state.

The waveform shaping circuit may include an n-th order filter (n is a positive integer) for reducing noise. Alternatively, the waveform shaping circuit includes an m-stage delay circuit (m is a positive integer). The selecting circuit may include a selection register for storing a selection data for setting one of the buffer circuit and the waveform shaping circuit to the active state.

The circuit device may further include a control unit for supplying a dummy signal as the signal to the buffer circuit when a dummy selection data is set in the selection register such that the buffer circuit is set to the active state, for comparing an output of the buffer circuit with a reference data, and for setting the selection data in the selection register such that the waveform shaping circuit is set to the active state when the output of the buffer circuit is different from the reference data, the dummy selection data being used as the selection data when the output of the buffer circuit and the reference data are coincident with each other.

When the circuit device is a semiconductor memory device, the circuit may be a memory section including a plurality of memory cells, and the signal may be one of address signals.

A plurality of such circuits are provided outside of the circuit device. In this case, the circuit device may include a plurality of the transfer circuits.

In order to achieve another aspect of the present invention, a method of correctly supplying a signal to a circuit, includes the steps of:

selectively setting one of a buffer circuit and a waveform shaping circuit to the active state based on a selection data;

buffer circuiting and transferring the signal to the circuit by the buffer circuit when the buffer circuit is set in the active state; and waveform-shaping and transferring the signal to the circuit by the waveform shaping circuit when the waveform shaping circuit is set in an active state.

In order to achieve still another aspect of the present invention, a signal transfer system includes a circuit device which includes a set of buffer circuits each of which receives a corresponding one of a set of signals in an active state to transfer to a circuit, a set of waveform shaping circuits which are respectively provided for the set of buffer circuits, and each of which receives the corresponding signal of the set of signals in an active state to waveform-shape the received signal and transfers the waveform-shaped signal to the circuit, and a set of registers which are respectively provided for the set of buffer circuits, and each of which stores a selection data for selectively setting one of a corresponding one of the set of buffer circuits and a corresponding one of the set of waveform shaping circuits to the active state, and a control unit for supplying a set of dummy signals as the set of signals to the set of buffer circuits when a set of dummy selection data are set in the set of registers such that the set of buffer circuits is set to the active state, for comparing an output of each of the buffer circuits with a reference data, and for setting the set of selection data in the set of registers such that the waveform shaping circuit is set to the active state when the output of one of the buffer circuit is different from the reference data, the dummy selection data being used as the selection data when the output of each of the buffer circuits and the reference data are coincident with each other.

DESCRIPTION OF THE PREFERRED EMBODIMENTS

Next, a signal transferring system including a signal transferring circuit of the present invention will be explained with reference to the attached drawings.

Figure 2A:
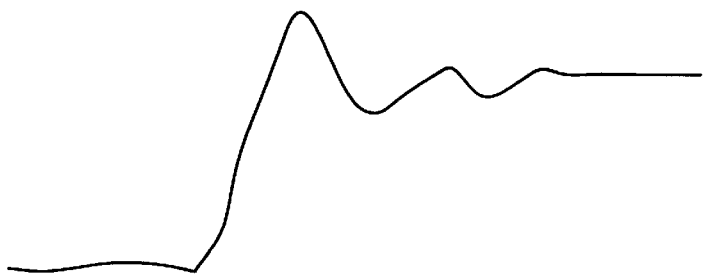
FIG. 2A is a diagram illustrating the waveform of a signal received by an integrated circuit located far apart from a signal outputting integrated circuit.
Figure 2B:
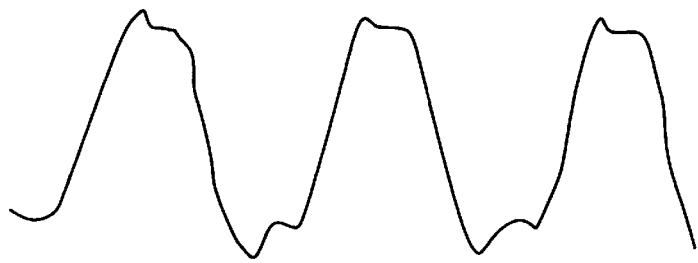
FIG. 2B is a diagram illustrating the waveform of a clock signal received by the integrated circuit located far apart from the signal outputting integrated circuit.
Figure 2C:
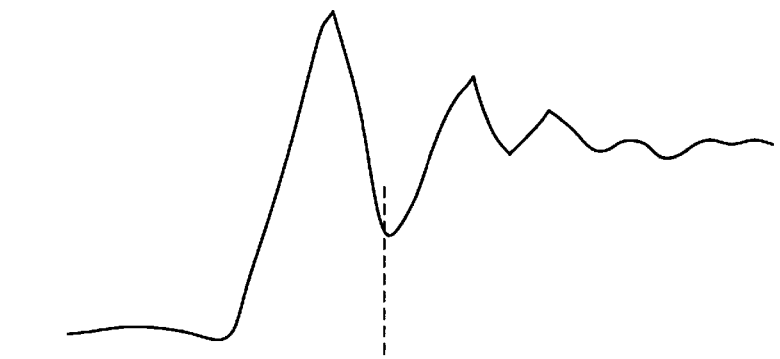
FIG. 2C is a diagram illustrating the waveform of the signal received by an integrated circuit located near the signal outputting integrated circuit.
Figure 2D:
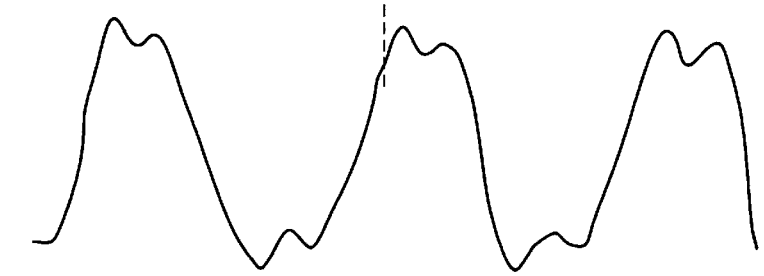
FIG. 2D is a diagram illustrating the waveform of the clock signal received by the integrated circuit located near the signal outputting integrated circuit.

FIGS. 2A to 2D are diagrams illustrating the waveforms of a signal and a clock signal received by an integrated circuits mounted on a printed circuit board. FIG. 2A shows the waveform of the signal received by the integrated circuit which is located far apart from an signal outputting integrated circuit. FIG. 2C shows the waveform of the signal received by the integrated circuit which is located near the signal outputting integrated circuit. FIGS. 2B and 2D show the waveforms of the clock signal received by the integrated circuits which are located far apart from and near the signal outputting integrated circuit, respectively. In case of the state shown in FIG. 2C, there is a possibility that the signal originally having the data of "1" is read as the signal having the data of "0".

Figure 1:
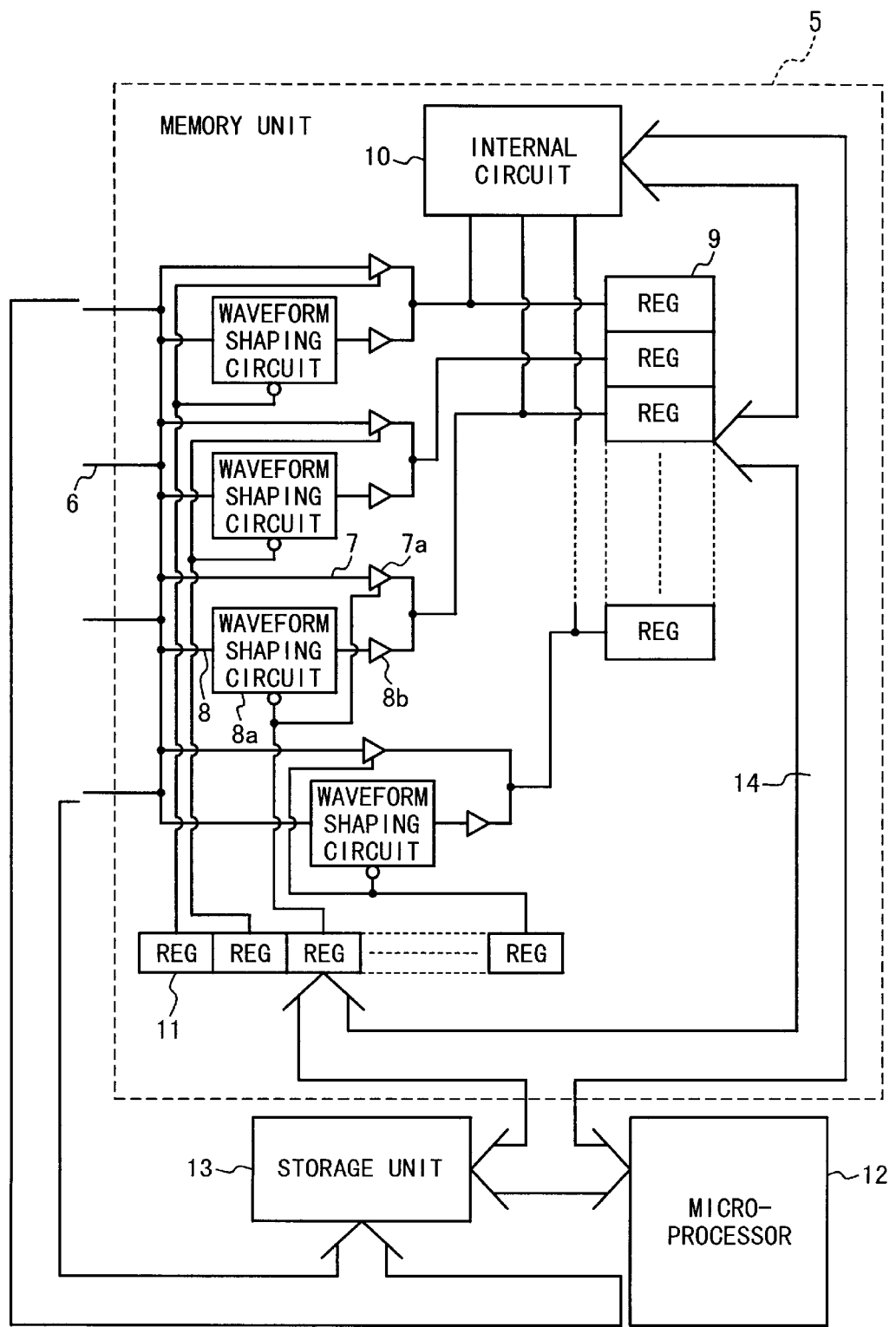
FIG. 1 is a block diagram illustrating of the structure of a circuit device according to an embodiment of the present invention.

FIG. 1 is a block diagram illustrating the structure of the signal transferring system including a signal transferring circuit according to the embodiment of the present invention.

Referring to FIG. 1, the signal transferring system is composed of a memory unit 5 shown by a broken line, a microprocessor 12 connected to the memory unit 5 via a bus line 14 and a storage unit 13 connected to the memory unit 5 and the microprocessor via a bus line 14. The memory unit 5 is composed of the signal transferring circuit which is composed of a plurality of buffer circuits 7a, a plurality of waveform shaping circuits 8a, a plurality of buffer circuits 8b, a set of registers 11 and another set of registers 9, and an internal circuit 10. The signal transferring circuit and the internal circuit 10 are desirably formed on the same semiconductor chip. However, the signal transferring circuit may be formed separated from the internal circuit 10.

A plurality of input signal lines 6 for transferring a set of signals such as address signals are connected to the plurality of buffer circuits 7a via a plurality of signal lines 7. The plurality of buffer circuits 7a are connected to the registers 9, respectively and to the internal circuit such as a memory section composed of a plurality of memory cells. The plurality of buffer circuits 7a are also connected to the registers 11, respectively.

A plurality of signal lines 8 are respectively connected to the plurality of signal lines 6 and are respectively connected to the plurality of waveform shaping circuits 8a. Each of the plurality of waveform shaping circuits 8a is composed of an n-th (n is a positive integer) order filter or an m-stage (m is a positive integer) delay element for noise reduction. The plurality of waveform shaping circuits 8a are connected to the registers 11, respectively. The outputs of the plurality of waveform shaping circuits 8a are connected to the internal circuit 10 via the plurality of buffer circuits 8b, respectively. Also, the outputs of the plurality of waveform shaping circuits 8a are connected to the registers 9 via the plurality of buffer circuits 8b, respectively.

The set of registers 9 are connected to the microprocessor 12 and the storage unit 13 via the bus 14. Also, the set of registers 9 are connected to the set of registers 11 via the bus 14, respectively. The set of registers 11 stores selection data, each of which is used for setting one of a corresponding one of the buffers 7a and a corresponding one of the waveform shaping circuits 8a to the active state.

The microprocessor 12 is connected the plurality of signal lines 6 and the storage unit 13 via another bus. The storage unit 13 stores an initializing program.

It should be noted that a plurality of such memory units 5 are mounted on a printed circuit board (not shown) together with a signal outputting integrated circuit (not shown).

Next, the operation of the signal transfer system will be explained below.

When a power supply is turned on, the initializing program which has been stored in the storage unit 13 is loaded into the microprocessor 12 in the signal transferring system shown in FIG. 1. The microprocessor 12 executes the initializing program. That is, a set of dummy selection data are set in the set of registers 11 such that the plurality of buffer circuits 7a are set to the active state. Also, a plurality of dummy signals are supplied to the plurality of signal lines 6. In this case, the plurality of dummy signals are transferred to the set of registers 9 via the plurality of buffer circuits 7a and then are latched by the set of registers 9, respectively.

Subsequently, the microprocessor 12 reads out the latched data bits from the set of registers 9 one bit by one bit and compares the read bit with the reference data bit. If the read bit is different from the reference data bit because of the waveform shown in FIG. 2C, new selection data is written in the register 11 corresponding to the read bit such that the waveform shaping circuit corresponding to the read bit can be set to the active state instead of the buffer circuit 7a. Thus, the correct signal can be supplied to the internal circuit 10 after this initializing process. Also, information indicative of the difference between the read bit and the reference data is written in the initializing program stored in the storage unit 13. That is, the waveform shaping circuit 8a can be activated instead of the buffer circuit 7a based on the information when the signal transfer system is started again in the practical operation. In this manner, the information may be automatically down-loaded from the storage unit 13 to the set of registers 11. In this case, the initializing process is only required to be executed once.

The storage unit 13 may be a semiconductor memory, a magnetic recording unit, a CD-ROM and so on. Also, the sets of registers 9 and 11 may be provided outside the memory unit 5. Further, the signal lines 7 and 8 for the input signals may be provided outside the memory unit 5. In addition, the signal transfer section composed of the buffer circuits 7a and 8b, the waveform shaping circuits 8a and registers 11 may be provided separated or independent from the internal circuit 10.

Figures 3A, 3B:
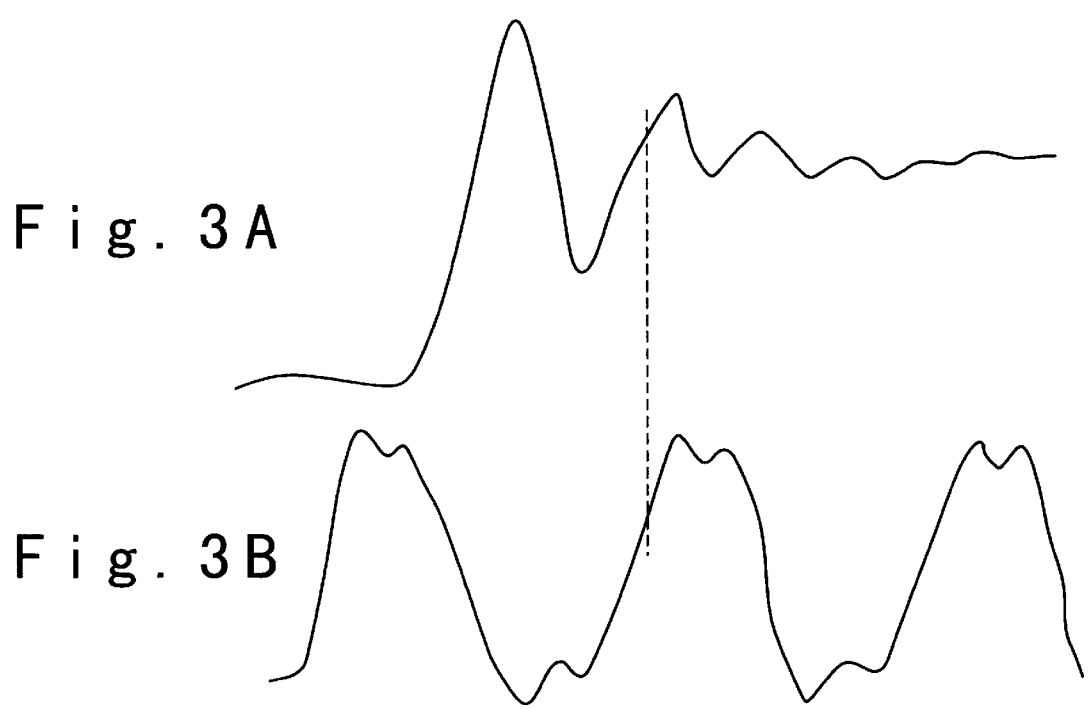
FIG. 3A is a diagram illustrating the waveform of the signal which is subjected to a delay and is received by an integrated circuit located near the signal outputting integrated circuit.
FIG. 3B is a diagram illustrating the waveform of the clock signal received by the integrated circuit located near the signal outputting integrated circuit.

FIG. 3A is a diagram illustrating the waveform of a signal when the signal outputted from a signal outputting integrated circuit is received an integrated circuit in which an m-stage delay circuit is used for the waveform shaping circuit. FIG. 3B is a diagram illustrating the waveform of a clock signal used at that time. By delaying the signal by the m-stage delay circuit, the internal circuit 10 can avoid a position where the signal amplitude is strongly downed due to reflection and can latch the signal as the data of "1".

As mentioned above, according to the present invention, when a power supply is turned on to start the signal transfer system, the elimination of influence by noise can be automatically performed for each of the input signal lines to the integrated circuits which are mounted on a printed circuit board. That is, the initializing program stored in the storage unit 13 is executed. Thus, the elimination of influence by noise can be automatically performed for each of the input signal lines to the integrated circuits which are mounted on a printed circuit board. As a result, the internal circuit 10 can avoid a position where the signal amplitude is strongly downed due to reflection and can latch the signal as the data of "1". For this reason, the evaluation period can be shortened without performing any additional design change.

Also, change of the input signal in waveform depending upon the printed circuit board can be flexibly coped in a software manner.

According to the circuit device of the present invention, an input signal and a reference data are compared in case of initialization. It is determined based on the comparing result whether the input signal is to be directly supplied to the internal circuit or a signal after the waveform shaping process of the input signal is to be supplied to the internal circuit. Thus, since the input signal with no distortion can be always supplied to the internal circuit, any erroneous operation of the internal circuit can be avoided.

Also, because the n-th order filter or m-stage delay circuit is used for the waveform shaping circuit, the waveform distortion of the input signal can be suppressed to be given to the internal circuit.

Further, since the selection data are held in the registers after the initializing process, the optimal signal path can be automatically selected.

In addition, the signal transfer circuit and the internal circuit can be provided on the same semiconductor chip. Therefore, the input signals can be supplied to the internal circuit without the waveform distortion of the input signals.

What is claimed is:

1. A circuit device including a transfer circuit, said transfer circuit comprising:
    a buffer circuit for receiving a signal in an active state to transfer said signal to a circuit;
    a waveform shaping circuit for receiving said signal in the active state to waveform-shape the received signal and for transferring the waveform-shaped signal to said circuit; and
    a selecting circuit for selectively setting one of said buffer circuit and said waveform-shaping circuit to the active state.

2. A circuit device according to claim 1, wherein said waveform shaping circuit includes an n-th order filter (n is a positive integer) for reducing noise.

3. A circuit device according to claim 1, wherein said waveform shaping circuit includes an m-stage delay circuit (m is a positive integer).

4. A circuit device according to claim 1, wherein said selecting circuit includes a selection register for storing a selection data for setting one of said buffer circuit and said waveform shaping circuit to the active state.

5. A circuit device according to claim 4, further comprising a control unit for supplying a dummy signal as said signal to said buffer circuit when a dummy selection data is set in said selection register such that said buffer circuit is set to the active state, for comparing an output of said buffer circuit with a reference data, and for setting said selection data in said selection register such that said waveform shaping circuit is set to the active state when the output of said buffer circuit is different from the reference data, the dummy selection data being used as said selection data when the output of said buffer circuit and the reference data are coincident with each other.

6. A circuit device according to claim 1, wherein said circuit device is a semiconductor memory device and includes said circuit which is a memory section including a plurality of memory cells, and said signal is one of address signals.

7. The circuit device according to claim 1, further comprising a plurality of transfer circuits, and wherein said transfer circuits are respectively coupled to a plurality of said circuits provided outside of said circuit device.

8. A method of correctly supplying a signal to a circuit, comprising the steps of:
    selectively setting one of a buffer circuit and a waveform shaping circuit to the active state based on a selection data;
    buffer circuiting and transferring said signal to said circuit by said buffer circuit when said buffer circuit is set in the active state; and
    waveform-shaping and transferring said signal to said circuit by said waveform shaping circuit when said waveform shaping circuit is set in an active state.

9. A method according to claim 8, wherein said waveform-shaping step includes filtering said signal by an n-th order filter (n is a positive integer).

10. A method according to claim 8, wherein said waveform-shaping step includes delaying said signal by an m-stage delay circuit (m is a positive integer).

11. A method according to claim 8, wherein said selectively setting step includes storing said selection data in a selection register.

12. A method according to claim 11, further comprising the steps of:
    supplying a dummy signal as said signal when a dummy selection data is set in said selection register such that said buffer circuit is set to the active state;
    comparing an output of said buffer circuit with a reference data; and
    setting said selection data in said selection register such that said waveform shaping circuit is set to the active state when the output of said buffer circuit is different from the reference data, and
    wherein the dummy selection data is used as said selection data when the output of said buffer circuit and the reference data are coincident with each other.

13. A method according to claim 8, wherein said method is executed in a semiconductor memory device and includes said circuit which is a memory section including a plurality of memory cells, and said signal is one of address signals.

14. A method according to claim 8, wherein said method is executed in a circuit device and a plurality of said circuits are provided on a same circuit board as said circuit device outside of said circuit device.

15. A signal transfer system comprising:
    a circuit device comprising:
        a set of buffer circuits each of which receives a corresponding one of a set of signals in an active state to transfer to a circuit, a set of waveform shaping circuits which are respectively provided for said set of buffer circuits, and each of which receives said corresponding signal of said set of signals in an active state to waveform-shape the received signal and transfer the waveform-shaped signal to said circuit, and a set of registers which are respectively provided for said set of buffer circuits, and each of which stores a selection data for selectively setting one of a corresponding one of said set of buffer circuits and a corresponding one of said set of waveform shaping circuits to the active state; and a control unit for supplying a set of dummy signals as said set of signals to said set of buffer circuits when a set of dummy selection data are set in said set of registers such that said set of buffer circuits is set to the active state, for comparing an output of each of said buffer circuits with a reference data, and for setting said set of selection data in said set of registers such that said waveform shaping circuit is set to the active state when the output of one of said buffer circuit is different from the reference data, the dummy selection data being used as said selection data when the output of each of said buffer circuits and the reference data are coincident with each other.

16. A signal transfer system according to claim 15, wherein each of said waveform shaping circuits includes an n-th order filter (n is a positive integer) for reducing noise.

17. A signal transfer system according to claim 15, wherein each of said waveform shaping circuits includes an m-stage delay circuit (m is a positive integer).

18. A signal transfer system according to claim 15, wherein said control unit includes:

a storage unit for storing a program for supplying said set of dummy signals as said set of signals to said set of buffer circuits when said set of dummy selection data are set in said set of registers such that said set of buffer circuits is set to the active state, for comparing an output of each of said buffer circuits with a reference data, and for setting said set of selection data in said set of registers such that said waveform shaping circuit is set to the active state when the output of one of said buffer circuit is different from the reference data, the dummy selection data being used as said selection data when the output of each of said buffer circuits and the reference data are coincident with each other; and a microprocessor for executing said program in a power on state.

* * * * *